(12) United States Patent
Futatsuya et al.

(10) Patent No.: US 7,577,556 B2
(45) Date of Patent: Aug. 18, 2009

(54) METHOD AND EQUIPMENT FOR SIMULATION

(75) Inventors: Hiroki Futatsuya, Kawasaki (JP); Satoru Asai, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 817 days.

(21) Appl. No.: 10/782,821

(22) Filed: Feb. 23, 2004

(65) Prior Publication Data

US 2005/0050490 A1    Mar. 3, 2005

(30) Foreign Application Priority Data

Sep. 1, 2003    (JP)    ............................. 2003-308919

(51) Int. Cl.
*G06G 7/48*    (2006.01)
(52) U.S. Cl. ........................................... 703/6; 716/19
(58) Field of Classification Search ..................... 703/6; 716/19
See application file for complete search history.

(56) References Cited

U.S. PATENT DOCUMENTS 5,278,421 A * 1/1994 Yoda et al. ............. 250/492.22
6,171,731 B1 * 1/2001 Medvedeva et al. ............ 430/5

OTHER PUBLICATIONS

Kimitoshi Takahashi et al.; "Proximity effect correction using pattern shape modification and area density map", 2000, Journal of Vacuum Science and Technology B, vol. 18, No. 6, pp. 3150-3157.*
Bruno La Fontaine et al.; "Analysis of Flare and its Impact on Low-k1 KrF and ArF Lithography", 2002, Proceedings of the SPIE, vol. 4691, pp. 44-56.*
Andreas Erdmann et al.; "Enhancements in Rigorous Simulation of Light Diffraction from Phase Shift Masks", 2002, Proceedings of SPIE, vol. 4691, pp. 1156-1167.*
Chris A. Mack; "Measuring and Modeling Flare in Optical Lithography", Jun. 2003, Optical Microlithography XVI, Proceedings of the SPIE, vol. 5040, pp. 151-161.*
Y. C. Pati et al.; "Exploiting Structure in Fast Aerial Image Computation for Integrated Circuit Patterns", 1997, IEEE Transactions on Semiconductor Manufacturing, vol. 10, No. 1, pp. 62-74.*
Teruyoshi Yao et al.; "Local Flare Effects and Correction in ArF Lithography", Jun. 2003, 2003 Symposium on VLSI Technology Digest of Technical Papers, pp. 43-44.*

(Continued)

*Primary Examiner*—Paul L Rodriguez
*Assistant Examiner*—Russ Guill
(74) *Attorney, Agent, or Firm*—Kratz, Quintos & Hanson, LLP

(57) ABSTRACT

The simulation equipment has division unit for dividing a layout of a photo mask (mask layout) into a plurality of areas, average light intensity value calculation unit for calculating an average value of light intensity in each of the areas, smoothing unit for subjecting the calculated average value to smoothing processing, and multiplication unit for multiplying the smoothed average value by a predetermined multiplier.

5 Claims, 10 Drawing Sheets

OTHER PUBLICATIONS

Fumio Murai et al.; "Fast proximity effect correction method using a pattern area density map", 1992, Journal of Vacuum Science and Technology B, vol. 10, No. 6, pp. 3072-3076.*

Joseph P. Kirk; "Scattered light in photolithographic lenses", 1994, Proceedings of SPIE, vol. 2197, pp. 566-572.*

Morimi Osawa et al.; "Correction for local flare effects approximated with double Gaussian profile in ArF lithography", Dec. 2003, Journal of Vacuum Science and Technology B, vol. 21, No. 6, pp. 2806-2809.*

Max Born and Emil Wolf; "Principles of Optics", 1970, fourth edition, pp. 526-532.*

Patent Abstracts of Japan, Publication No. 2001-272766 dated Oct. 5, 2001./Discussed in the specification.

* cited by examiner

| T(i-2,j-2) | T(i-1,j-2) | T(i,j-2) | T(i+1,j-2) | T(i+2,j-2) |
| --- | --- | --- | --- | --- |
| T(i-2,j-1) | T(i-1,j-1) | T(i,j-1) | T(i+1,j-1) | T(i+2,j-1) |
| T(i-2,j) | T(i-1,j) | T(i,j) | T(i+1,j) | T(i+2,j) |
| T(i-2,j+1) | T(i-1,j+1) | T(i,j+1) | T(i+1,j+1) | T(i+2,j+1) |
| T(i-2,j+2) | T(i-1,j+2) | T(i,j+2) | T(i+1,j+2) | T(i+2,j+2) |

| 0.03 | 0.02 | 0.08 | 0 | 0.02 |
| --- | --- | --- | --- | --- |
| 0.25 | 0.13 | 0.25 | 0.70 | 0.13 |
| 0.25 | 0.20 | 0.30 | 0.13 | 0.13 |
| 0.25 | 0.13 | 0.25 | 0.80 | 0.13 |
| 0.05 | 0.02 | 0.05 | 0.70 | 0.02 |

C : CENTER OF LENS
$S_k$ : POSITION OF DIFFRACTED LIGHT
NA : NUMERICAL APERTURE OF LENS
σ : DIAMETER OF LIGHT SOURCE WITH RESPECT TO NA
 (INTERFERENCE FACTOR)

C : CENTER OF LENS
$S_k'$ : POSITION OF DIFFRACTED LIGHT
NA : NUMERICAL APERTURE OF LENS
$\sigma_1$ : INTERNAL DIAMETER OF RING-SHAPED LIGTH SOURCE WITH RESPECT TO NA
$\sigma_2$ : EXTERNAL DIAMETER OF RING-SHAPED LIGTH SOURCE WITH RESPECT TO NA

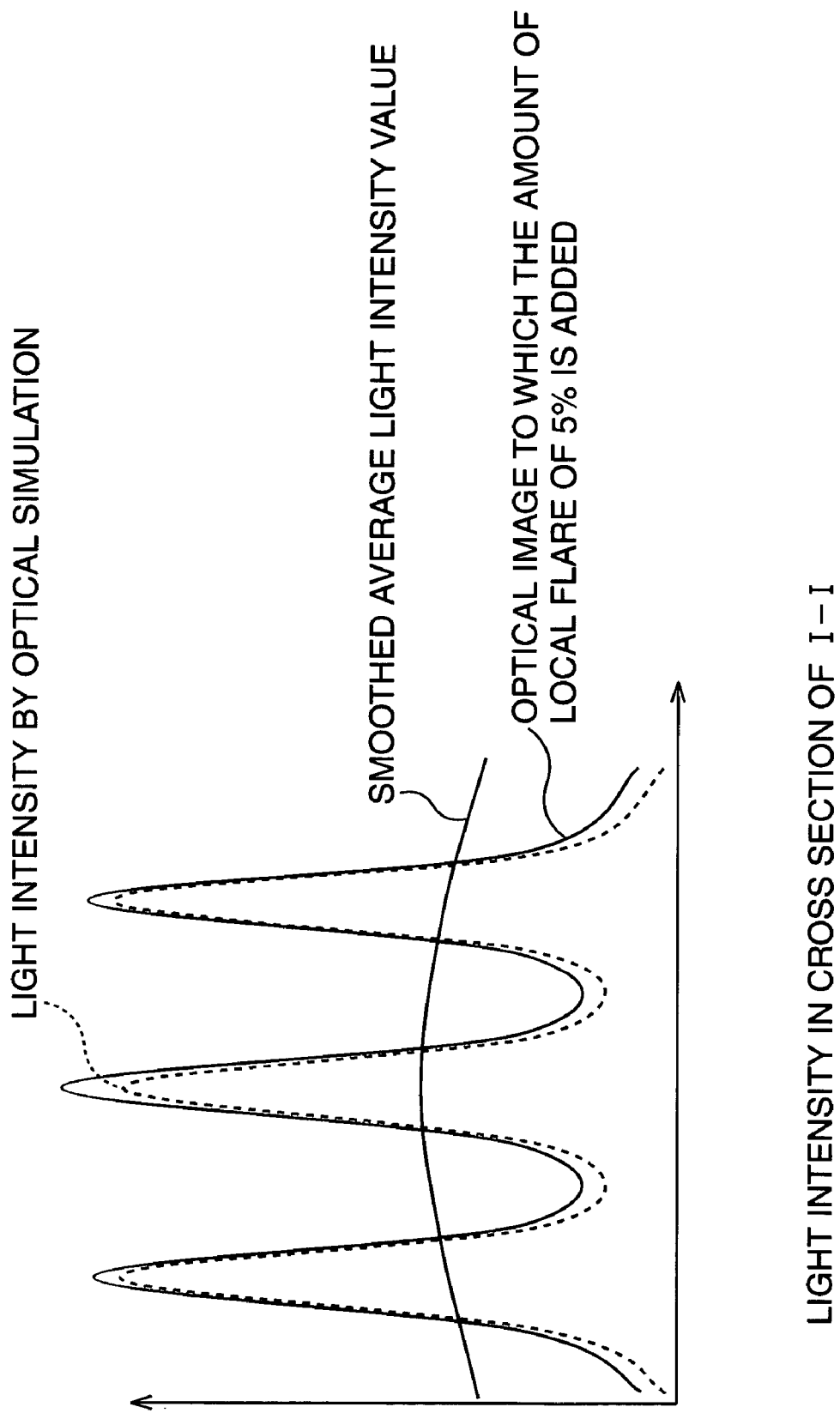

180
METHOD AND EQUIPMENT FOR SIMULATION

CROSS-REFERENCE TO RELATED APPLICATIONS

This application is based upon and claims the benefit of priority from the prior Japanese Patent Application No. 2003-308919, filed on Sep. 1, 2003, the entire contents of which are incorporated herein by reference.

BACKGROUND OF THE INVENTION

1. Field of the Invention

The present invention relates to a method and equipment for simulation which correct flare (local flare) locally occurring in the photo process of semiconductor manufacturing.

2. Description of the Related Art

Pattern formation technology in manufacturing a semiconductor device adopts optical lithography. The optical lithography refers to a method in which a desired pattern formed in a reticle as a photo mask is transferred to a sample substrate through a reduction optical system. Photosensitive resin called a resist is formed on the sample substrate. With the use of difference in the melting speed between exposed areas and unexposed areas by developing solution, a latent image of the transferred pattern is etched to desirably process material.

Exposure technology adopts optical proximity correction (OPC), in which the effect of traces in proximity to each other is calculated and corrected to transfer the fine pattern with high precision, in addition to optimizing the wavelength of exposure light and the structure of the reticle. A transferred image of the pattern is simulated in consideration of the illumination condition (NA and Sigma) and the exposure condition (the material of the resist and exposure wavelength) and the like of an exposure device, and the effect of optical proximity and correction values are calculated or determined by experiment, to correct the dimensions of the reticle.

Generally, when the optical proximity correction is carried out, an optical image of the layout of the photo mask (mask layout) is calculated by a simulator, and then the mask layout is so modified that the calculated optical image takes a predetermined shape. It is necessary as a precondition that the optical image outputted from the simulator precisely corresponds with actual one. The unevenness in the material of a lens of the exposure device and the specific characteristics thereof, however, cause scattering in the lens, so that the effect of scattering also has to be considered in the simulation. The effect of scattering, called local flare, is caused by the specialty of lens material which depends on the wavelength of exposure light (short wavelength represented by 193 nm) and the like. The effect of scattering becomes a main cause of unexpected deformation in the shape of a transferred pattern and in the width of traces. In an image surface, it is possible to approximate the local flare at even light intensity in a background which depends on the intensity transmittance of the photo mask.

Patent document 1: Japanese Patent Application Laid-Open No. 2001-272766.

In a conventional simulation method, when the dimensions of traces are enough larger than an exposure wavelength, it is possible to estimate the amount of local flare with sufficient accuracy. When there are traces the dimensions of which are equal to or smaller than the exposure wavelength, however, there is a problem that the amount of local flare cannot be obtained with high accuracy. As the pattern of a semiconductor device becomes finer and finer in recent years, it is desirable to develop a simulation method which estimates the amount of local flare with high accuracy even if a trace is fine.

SUMMARY OF THE INVENTION

Considering the foregoing problem, an object of the present invention is to provide a method and equipment for simulation which estimate the amount of local flare with extremely high accuracy and precisely predict the occurrence of the local flare, not only when the dimensions of traces are larger than an exposure wavelength, but when the traces equal to or smaller than the exposure wavelength are mixed in a pattern.

A method for simulation according to the present invention, which simulates an amount of occurrence of local flare occurring in an exposure process in manufacturing a semiconductor device, comprises the steps of dividing a layout of a photo mask into a plurality of areas, calculating an average value of light intensity in each of the areas, and estimating the amount of occurrence of local flare in each of the areas on the basis of each of the average values.

Equipment for simulation according to the present invention, which simulates an amount of occurrence of local flare occurring in an exposure process in manufacturing a semiconductor device, comprises division means for dividing a layout of a photo mask into a plurality of areas, and average light intensity value calculation means for calculating an average value of light intensity in each of the areas, in order to estimate the amount of occurrence of local flare in each of the areas on the basis of each of the average values.

According to the method and equipment for simulation of the present invention, even if traces equal to or smaller than an exposure wavelength are mixed in a pattern, it is possible to estimate the amount of local flare with extremely high accuracy, and precisely predict the occurrence of the local flare. The dimensions of traces are easily and precisely corrected based on simulation results, so that it is possible to actualize a highly reliable semiconductor device.

BRIEF DESCRIPTION OF THE DRAWINGS

FIG. 11 is a graph showing the relation between a position in the photo mask and a light intensity value.

DETAILED DESCRIPTION OF THE PREFERRED EMBODIMENTS

Essential Features of the Present Invention

First, the essential features of the present invention will be described.

The inventor was dedicated to studying a method for estimating the amount of local flare with high accuracy, even if traces equal to or smaller than an exposure wavelength are mixed in a pattern, and has found that the method is built on the following theory.

Figures 1A, 1B, 1C:
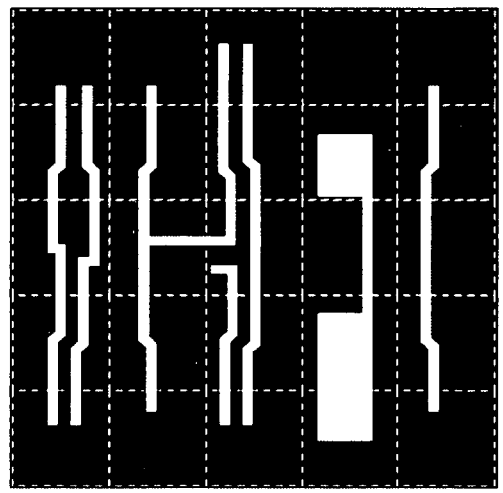
FIG. 1A is a schematic plan view showing the mask layout of a photo mask in which the amount of local flare is evaluated in a conventional method.
FIGS. 1B and 1C are explanatory views showing an example of intensity transmittance and an example of evaluation values.

FIG. 1A is a schematic plan view showing the mask layout of a photo mask in which the amount of local flare is evaluated in a conventional method, and FIGS. 1B and 1C are explanatory views showing an example of intensity transmittance and an example of evaluation values.

In the conventional method, as shown in FIG. 1A, the mask layout is divided into a plurality of rectangular areas. The transmittance (open ratio) of each area calculated and smoothed is estimated as the amount of local flare. In other words, when an area (i,j) is decided as shown in FIG. 1B, the predicted amount of local flare F (i,j) in the area (i,j) is obtained by the following equation (1). FIG. 1C shows the calculation results of each area.

$$F(i, j) = \sum_{i'=-2}^{2} \sum_{j'=-2}^{2} E(i', j') \times T(i+i', j+j') \quad (1)$$

Wherein, T (i,j) is the average value of transmittance in the area (i,j), and E (i',j') is a weighting factor which represents the degree of effect of the area. For convenience of explanation, only the equation for the area (i,j) is described above, and smoothing processing is carried out with respect to two areas adjoining forward and backward.

In the foregoing conventional method, there is a case where simulation result does not match with the actual amount of local flare, because the amount of local flare is estimated on the basis of the intensity transmittance of the mask layout before passing through a lens of an exposure device. In other words, light passing through a fine mask pattern in the photo mask is diffracted, and light diffracted with a large angle does not pass through the lens.

Considering that only light passing through the lens of the exposure device, out of light passing through the mask pattern, is provided for exposure, the inventor has come up with an idea of using the average value of light intensity distribution in an image surface on which the light forms an image of the mask pattern, instead of the average value of the intensity transmittance of the mask pattern used in the conventional method in order to grasp only the effect of the above-mentioned light accurately.

Concrete Embodiments of the Present Invention

Figure 2:
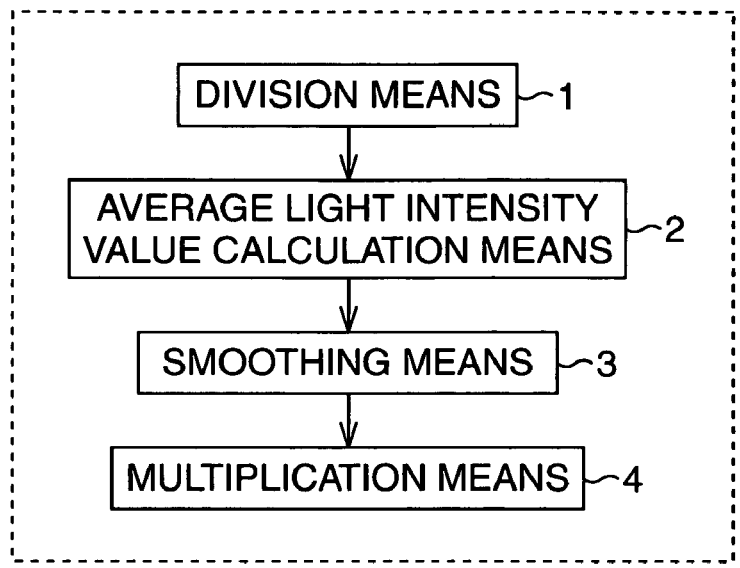
FIG. 2 is a block diagram showing the schematic structure of simulation equipment according to the present invention.
Figure 3:
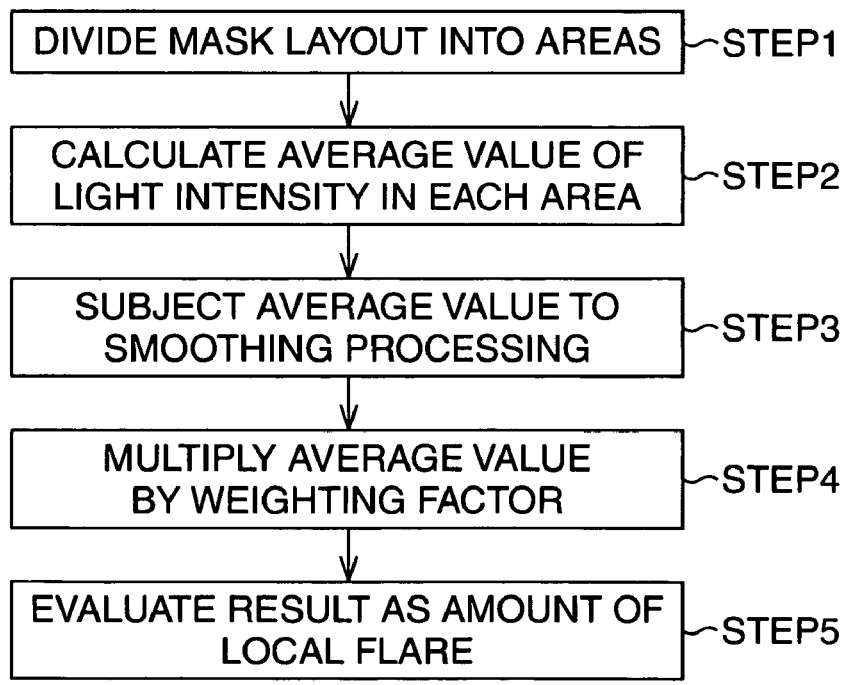
FIG. 3 is a flow chart showing a simulation method according to the present invention.

FIG. 2 is a block diagram showing the schematic structure of simulation equipment according to the present invention, and FIG. 3 is a flow chart of a simulation method according to the present invention.

Figure 4:
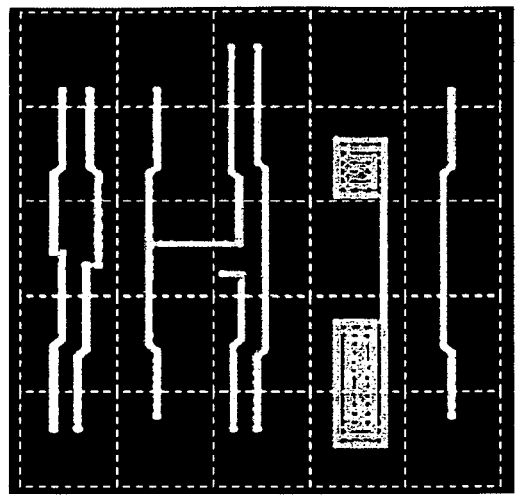
FIG. 4A is a schematic plan view showing the mask layout of a photo mask in which the amount of local flare is evaluated.
FIGS. 4B and 4C are explanatory views showing an example of light intensity distribution and an example of evaluation values.

The simulation equipment comprises division means 1 for dividing the layout of a photo mask (mask layout) into a plurality of areas, average light intensity value calculation means 2 for calculating the average value of light intensity in each area, smoothing means 3 for subjecting the calculated average value to smoothing processing, and multiplication means 4 for multiplying the smoothed average value by a predetermined multiplier. To evaluate the amount of local flare with the use of the simulation equipment, first, as shown in FIG. 4A, the division means 1 divides the mask layout into a plurality of areas (step 1). Then, the average light intensity value calculation means 2 calculates the average value of light intensity in each area (step 2), and the smoothing means 3 smoothes the calculated average value of light intensity (step 3). Then, the multiplication means 4 multiplies the smoothed average value of light intensity by a predetermined multiplier (step 4), and each obtained value is evaluated as the amount of occurrence of local flare in each area (step 5).

To be more specific, as shown in FIG. 4B, the average value of light intensity I (i,j) is used instead of T (i,j) in FIG. 1. The amount of local flare F (i,j) in an area (i,j) to be predicted is calculated by the following equation (2). FIG. 4C shows the calculation result of each area.

$$F(i, j) = \sum_{i'=-2}^{2} \sum_{j'=-2}^{2} E(i', j') \times I(i+i', j+j') \quad (2)$$

wherein, I (i,j) is the average value of light intensity in the area (i,j), and E (i',j') is a weighting factor which represents the degree of effect of the area. For convenience of explanation, only the equation for the area (i,j) is described above, and the smoothing processing is carried out with respect to two areas adjoining forward and backward.

According to this method, the amount of local flare is calculated on the basis of the average value of light intensity of an optical image on a wafer after passing through a lens of an exposure device. By doing so, since light not passing through the lens is not included in the calculation of local flare, the amount of local flare is calculated in a situation closer to actual one, so that predictive accuracy is improved.

To carry out the foregoing calculation, it is necessary to obtain the light intensity of the mask layout. It is unrealistic, however, to calculate the light intensity of the whole mask layout by use of a conventional light intensity simulation method, for the reason of processing time. Thus, noting that what is necessary is the average value of light intensity, diffracted light is calculated by a Fourier transformed image in each area of the mask layout, and the average value of light intensity is obtained by multiplying the light intensity of the diffracted light passing through a projection lens by a predetermined multiplier. In the concrete, the average value of light intensity (I) is calculated with the use of the following equation (3).

$$I = \sum_{k=1}^{N} F_k S_k S_k^* \quad (3)$$

wherein, "$F_k$" is a weighting factor of diffracted light (a real number), and "$S_k$" is the amplitude of the diffracted light (a complex number: an asterisk (*) represents a complex conjugate number.), "k" representing the number of the diffracted light corresponds to the combination of (n,m) one to one. ("n" and "m" are the orders of diffracted light in X and Y directions, respectively.)

The average value of light intensity is obtained area by area (i,j). On the assumption that the area (i,j) is periodic, Fourier transforming the area (i,j) makes it possible to obtain the diffracted light. When the area is enough larger than an exposure wavelength (approximately five times), there is no problem with the assumption that the area is periodic. The weighting factor "$F_k$" of the diffractive light includes information whether or not the diffractive light passes through the lens. The weighting factor "$F_k$" of the diffractive light is obtained as shown in FIG. 5.

Figure 5:
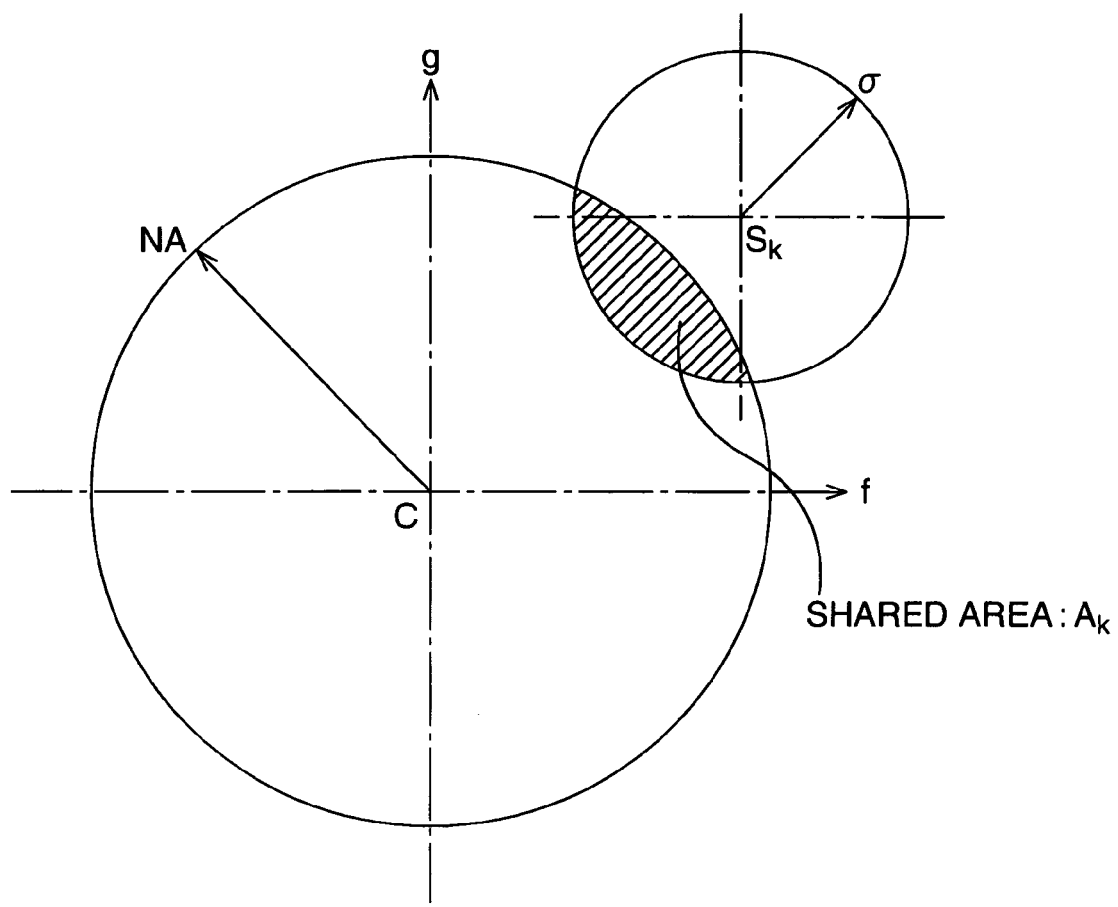
FIG. 5 is a schematic diagram which explains a method of determining the weighting factor of diffracted light.

Referring to FIG. 5, "C" is the center of the lens in the exposure device, "$S_k$" is the position of diffracted light, "NA" is the numerical aperture of the lens, and "σ" is the radius of light source with respect to "NA" (an interference factor). The area "$A_k$" shared between a circle "C" and a circle "$S_k$" is in proportion to the weighting factor of the diffracted light "$S_k$". The area "$A_k$" is also in proportion to a probability that the diffracted light passes through the lens. "$A_k$" is divided by "$\sigma^2\pi$" and normalized to obtain the weighting factor "$F_k$". The definitive weighting factor is represented by the following equation (4).

$$F_k = A_k/(\sigma^2\pi) \quad (4)$$

Figure 6:
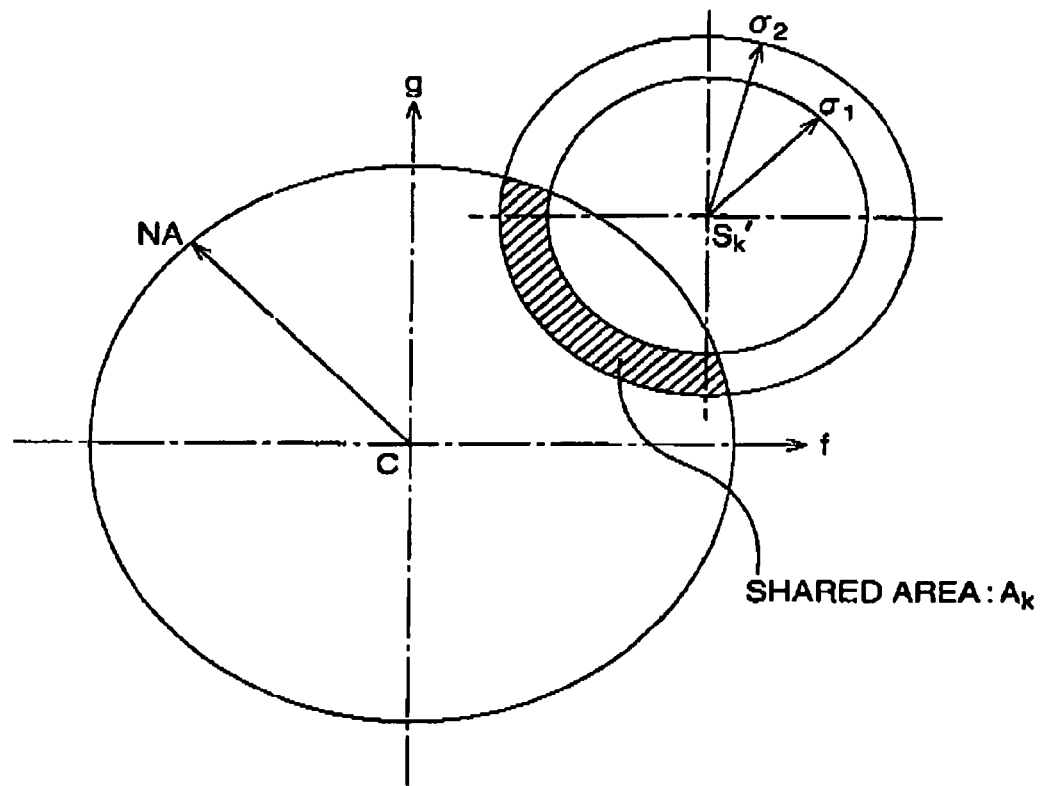
FIG. 6 is a schematic diagram which explains a method of determining the weighting factor of diffracted light, when a ring-shaped lamp is used.

When a ring-shaped lamp is used, the weighting factor is obtained as shown in FIG. 6, and is represented by the following equation (5).

$$F_k' = A_k'/(\sigma_2^2\pi - \sigma_1^2\pi) \quad (5)$$

Also, the average value of light intensity (I) is calculated with the use of the following equation:

$$\bar{I} = \sum_{k=1}^{N} F_k' S_k' S_k'^*$$

wherein, "$F_k'$" is a weighting factor of diffracted light (a real number), and "$S_k'$" is the amplitude of the diffracted light (a complex number: an asterisk (*) represents a complex Conjugate number.), "k" representing the number of the diffracted light corresponds to the combination of (n,m) one to one, ("n" and "m" are the orders of diffracted light in X and Y directions respectively.)

The circular or ring-shaped light source is used in the foregoing description, but the essence is to calculate the area shared between the shape of a light source and a lens circle. It is apparent that this method is applicable in a lighting situation except for above.

The simulation value of the amount of local flare, obtained as described above, is used for optical proximity correction (OPC), or, as described later, is added to a light intensity value by optical simulation in order to provide it for the simulation of an optical image.

According to this embodiment, as described above, it is possible to actualize simulation by which the amount of local flare is estimated with extremely high accuracy and the occurrence of the local flare is precisely predicted, not only when the dimensions of traces are larger than the exposure wavelength, but when the traces equal to or smaller than the exposure wavelength are mixed in the mask pattern.

By operating a program product stored in a RAM, ROM or the like of a computer, it is possible to actualize each means (means 1 to 4 of FIG. 2 and the like) for constituting the foregoing simulation equipment, and each step (the steps 1 to 5 of FIG. 3 and the like) in the simulation method. The present invention includes that program product, and a computer-readable recording medium in which the program product is stored.

To be more specific, the program product is provided for the computer via the recording medium such as, for example, a CD-ROM or various transmission media. As the recording medium for recording the program product, a flexible disk, a hard disk, a magnetic tape, a magneto-optical disk, a nonvolatile memory card or the like is available in addition to the CD-ROM. As the transmission medium of the program product, on the other hand, a computer network (WAN such as LAN, the Internet and the like, a wireless communication network and the like) or a communication medium in a system (a wire circuit such as an optical fiber and the like, a wireless circuit and the like) is available.

Not only when the function of the foregoing embodiment is actualized by running the program product provided for the computer, but when the program product actualizes the function of the foregoing embodiment in cooperation with an OS (operating system), other application software or the like which the program product runs on the computer, or when the whole or a part of processing of the provided program product is carried out by a function enhancement board or unit of the computer to actualize the function of the foregoing embodiment, the present invention includes that program product.

Figure 7:
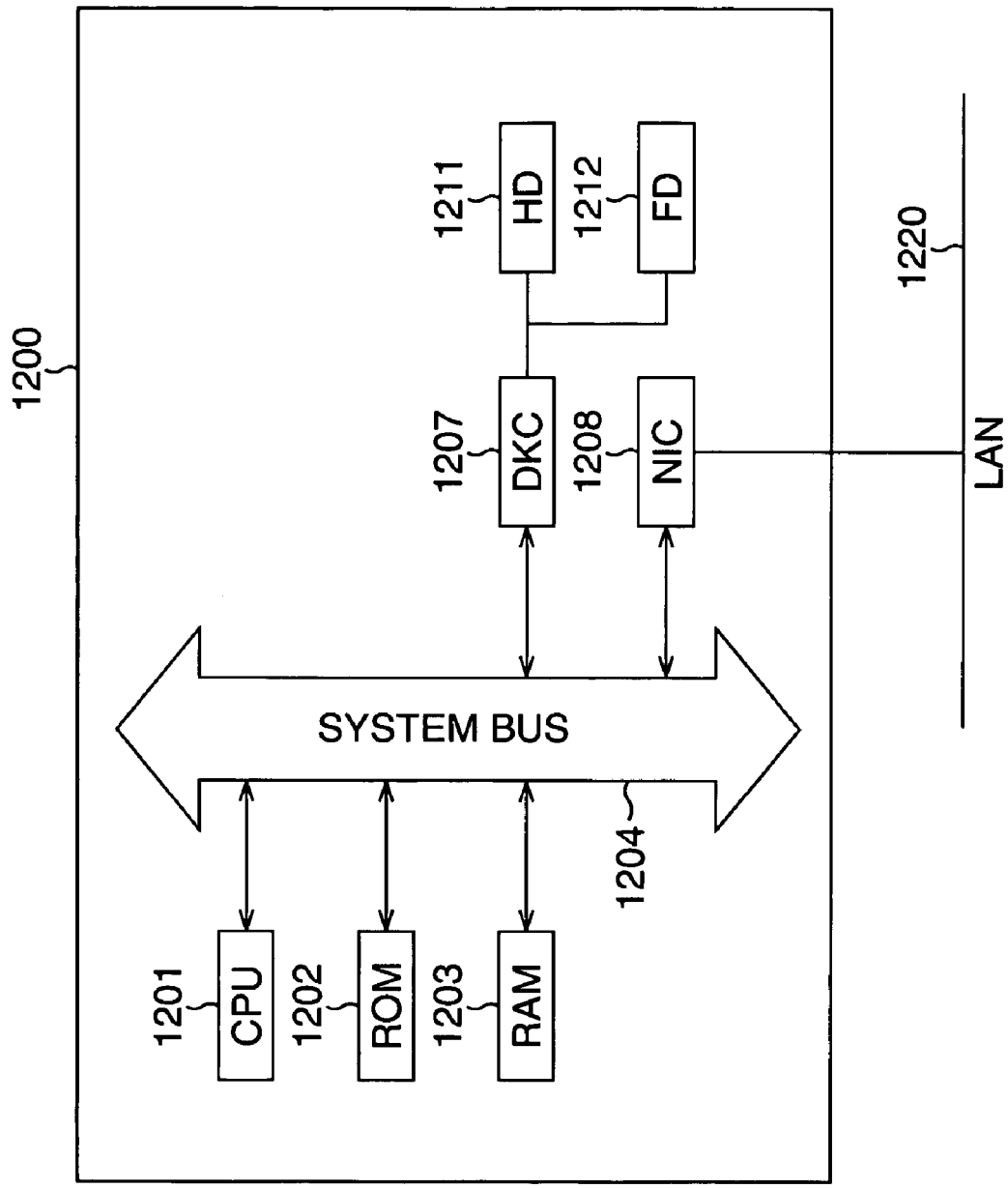
FIG. 7 is a block diagram showing the internal structure of a personal user terminal.

FIG. 7, for instance, is a block diagram showing the internal structure of a general personal user terminal. Referring to FIG. 7, the reference numeral 1200 denotes a personal computer (PC). The PC 1200 having a CPU 1201 runs device control software stored in a ROM 1202 or a hard disk (HD) 1211 or provided by a flexible disk drive (FD) 1212, in order to control each device connected to a system bus 1204 as a whole.

EMBODIMENTS

Hereafter, some embodiments in which the amount of local flare is actually estimated with the use of the method according to the present invention will be described.

First Embodiment

Figure 8:
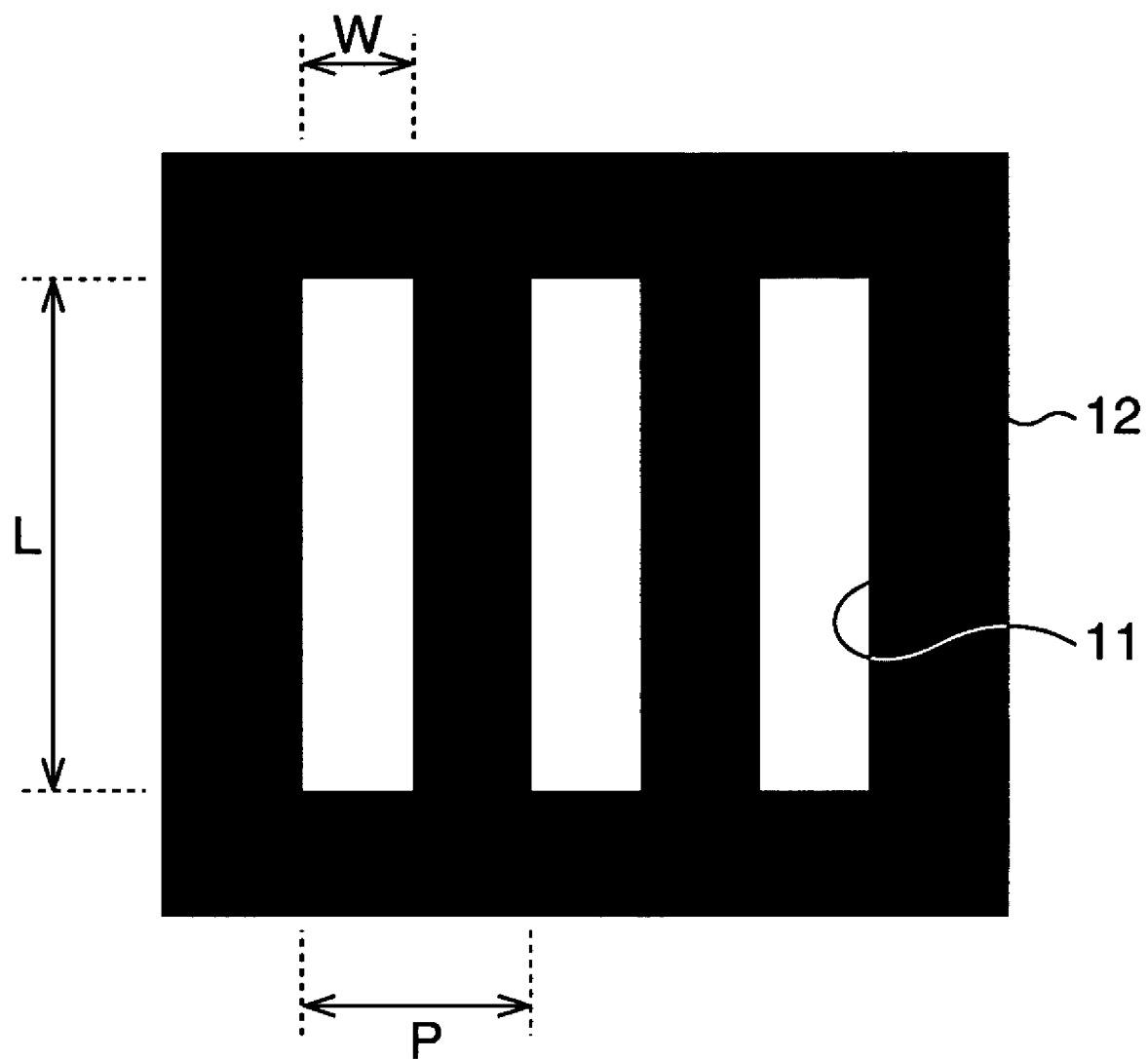
FIG. 8 is a schematic plan view showing the mask layout of a photo mask according to a first embodiment.

In the first embodiment, the average value (relative value) of light intensity of a photo mask having a layout shown in FIG. 8 is obtained with the use of the method according to the present invention. The photo mask has a line-and-space pattern in which the width of an opening 11 is equal to that of a light shielding portion 12. It is assumed that the length "L" of the opening 11 is much longer than the width "W" thereof.

Figure 9:
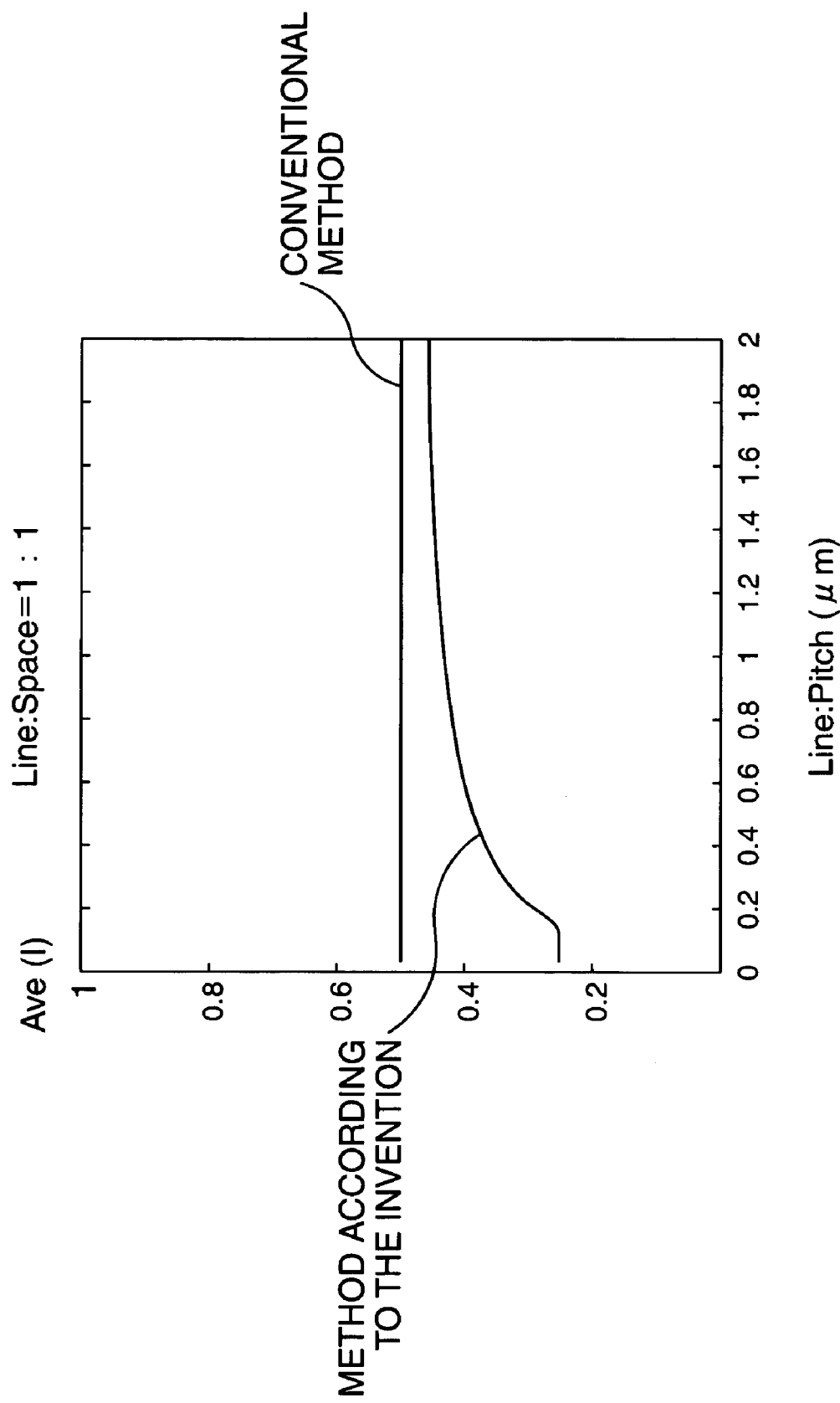
FIG. 9 is a graph showing the relation between a line pitch and a light intensity value in the photo mask.

FIG. 9 is a graph of characteristics showing the relation between a line pitch in the photo mask and the value of light intensity.

FIG. 9 shows the average values of light intensity calculated by a method of the present invention, in relation to line pitches "P". The average values of intensity transmittance according to a conventional method are also put therein for comparison purpose. In this embodiment, the average value is calculated on the condition that "NA" is 0.7, an exposure wavelength is 193 nm, and an interference factor is 0.8.

According to the conventional method, since the width of the opening 11 of the photo mask is equal to that of the light shielding portion 12 the average value of intensity transmittance becomes constant (0.5) irrespective of the line pitch. According to this method, on the other hand, diffracted light passing through a lens decreases as the line pitch becomes smaller, so that the average value of light intensity decreases as a result. This means that this method reflects the variation in the amount of local flare depending on the line pitch, and produces realistic values.

Second Embodiment

In the second embodiment, the amount of local flare calculated by the method of the present invention is added to an optical image by optical simulation, to obtain an optical image in consideration of local flare. In this embodiment, it is assumed that the ratio of the amount of local flare to the intensity of the optical image is 5%.

Figure 10:
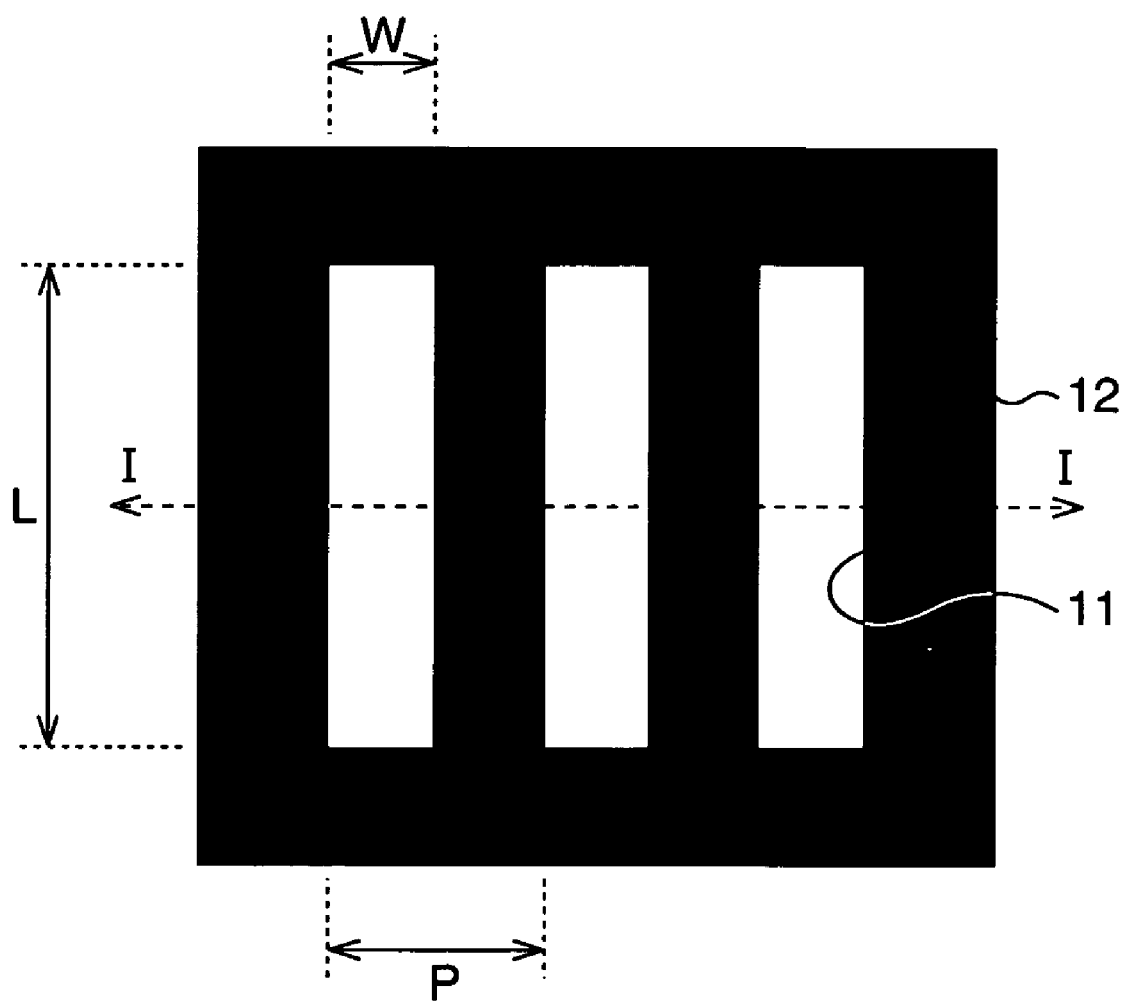
FIG. 10 is a schematic plan view showing the mask layout of a photo mask according to a second embodiment.

FIG. 10 shows the shape of a photo mask used in the calculation of this method. The photo mask identical to that of FIG. 7 has a line-and-space pattern in which the width of an opening 11 is equal to that of a light shielding portion 12 and has a line pitch of 0.5 μm. It is assumed that the length "L" of the opening 11 is much longer than the width "W" thereof.

FIG. 11 is a graph of characteristics showing the relation between the position in the photo mask and the value of light intensity. The position in FIG. 11 corresponds to the position in the photo mask along the broken line I-I of FIG. 10.

FIG. 11 shows the average value of light intensity calculated by the method of the present invention and subjected to smoothing processing, the optical image by optical simulation, and the result of adding the average value of light intensity to the optical image, namely adding the amount of local flare of 5% to the optical image. As described above, the average value of light intensity calculated by this method contributes to the accurate simulation of an optical image in consideration of local flare.

What is claimed is:

1. A computer-readable storage medium having stored thereon a computer program for use in optical corrections to obtain a more accurate optical image for simulating an amount of occurrence of local flare which occurs in an exposure process in manufacturing a semiconductor executable to perform the steps of:
    dividing a layout of a photo mask into a plurality of areas;
    calculating an average value of light intensity in each of the areas;
    simulating and estimating an amount of occurrence of local flare in each of the areas on the basis of each of the average values, for use in optical corrections to obtain a more accurate optical image, and
    correcting dimensions of the photo mask based on the estimated amount of occurrence of local flare, wherein
    when a circular-shaped light source is used, the average value of light intensity $$\bar{I} = \sum_{k=1}^{N} F_k S_k S_k^*,$$

and N is 1 or more natural number, $F_k$ is a weighting factor of diffracted light, $S_k$ is the amplitude of the diffracted light, and $F_k = A_k/(\sigma^2 \pi)$ where $A_k$ is the area shared between a circle C having a radius NA, the numerical aperture of a lens, and a circle $S_k$ having a radius of the light source with respect to NA, and σ is the radius of the circular shaped light source with respect to NA, and when a ring-shaped light source is used, the average value of light $$\bar{I} = \sum_{k=1}^{N} F_k' S_k' S_k'^*,$$

intensity and N is 1 or more natural number, $F_k'$ is a weighting factor of diffracted light, $S_k'$ is the amplitude of the diffracted light, and $F_k' = A_k'/(\sigma_2^2 \pi - \sigma_1^2 \pi)$ where $A_k'$ is the area shared between a circle C having a radius NA, the numerical aperture of a lens, and a ring $S_k'$ having a radius of the light source with respect to NA, where $\sigma_1$ is the inside radius and $\sigma_2$ is the outside radius of the ring-shaped light source with respect to NA.

2. The simulation method according to claim 1, wherein each of the average values is subjected to smoothing processing, a smoothed average value is multiplied by a first multiplier, and an obtained value is evaluated as the amount of occurrence of local flare in each of the areas.

3. The simulation method according to claim 1, wherein when the average value of light intensity in each of the areas is calculated, diffracted light is calculated by a Fourier transformed image of each of the areas of the layout, and the average value is calculated by multiplying the light intensity of the diffracted light passing through a projection lens by a second multiplier.

4. The simulation method according to claim 1, wherein each of the values evaluated as the amount of occurrence of local flare is added to the light intensity in order to simulate an optical image.

5. The simulation method according to claim 1, wherein each of the values evaluated as the amount of occurrence of local flare is used in optical proximity correction.

* * * * *